United States Patent
LaVine et al.

(10) Patent No.: US 11,256,569 B2
(45) Date of Patent: Feb. 22, 2022

(54) ERROR CORRECTING BITS

(71) Applicant: Arm Limited, Cambridge (GB)

(72) Inventors: Mark Gerald LaVine, Austin, TX (US); Simon John Craske, Cambridge (GB)

(73) Assignee: Arm Limited, Cambridge (GB)

( * ) Notice: Subject to any disclaimer, the term of this patent is extended or adjusted under 35 U.S.C. 154(b) by 21 days.

(21) Appl. No.: 16/732,465

(22) Filed: Jan. 2, 2020

(65) Prior Publication Data

US 2021/0208968 A1 Jul. 8, 2021

(51) Int. Cl.
*G06F 11/10* (2006.01)
*G11C 29/36* (2006.01)

(52) U.S. Cl.
CPC .......... *G06F 11/1076* (2013.01); *G11C 29/36* (2013.01)

(58) Field of Classification Search
CPC ........................... G06F 11/1076; G11C 29/36
See application file for complete search history.

(56) References Cited

U.S. PATENT DOCUMENTS

| 2014/0019823 | A1* | 1/2014 | Ramirez | G06F 1/3275 714/755 |
| 2017/0068621 | A1* | 3/2017 | Watanabe | G06F 12/0871 |
| 2018/0068719 | A1* | 3/2018 | Lin | G06F 12/00 |
| 2019/0384718 | A1* | 12/2019 | Hansson | G11C 7/106 |

FOREIGN PATENT DOCUMENTS

WO 2019/069042 4/2019

OTHER PUBLICATIONS

Combined Search and Examination Report for GB Application No. 2019256.3 dated Jun. 30, 2021, 8 pages.

* cited by examiner

*Primary Examiner* — Kyle Vallecillo
(74) *Attorney, Agent, or Firm* — Nixon & Vanderhye P.C.

(57) ABSTRACT

A data processing apparatus is provided, which includes storage circuitry comprising a plurality of lines, each of the plurality of lines comprising a data value. Access circuitry accesses a pair of the plurality of lines at a time, the pair of the plurality of lines comprising a further data value, distinct from the data value, and a plurality of error bits to detect or correct errors in the data value in each line in the pair of the plurality of lines.

19 Claims, 7 Drawing Sheets

ECC_inversion_tag0[7:0]  =  8'b00000011
ECC_inversion_tag1[7:0]  =  8'b00000101
ECC_inversion_tag2[7:0]  =  8'b00000110
ECC_inversion_tag3[7:0]  =  8'b00001001
ECC_inversion_tag4[7:0]  =  8'b00001010
ECC_inversion_tag5[7:0]  =  8'b00001100
ECC_inversion_tag6[7:0]  =  8'b00010001
ECC_inversion_tag7[7:0]  =  8'b00010010
ECC_inversion_tag8[7:0]  =  8'b00010100
ECC_inversion_tag9[7:0]  =  8'b00011000
ECC_inversion_tag10[7:0] =  8'b00100001
ECC_inversion_tag11[7:0] =  8'b00100010
ECC_inversion_tag12[7:0] =  8'b00100100
ECC_inversion_tag13[7:0] =  8'b00101000
ECC_inversion_tag14[7:0] =  8'b00110000
ECC_inversion_tag15[7:0] =  8'b01000001

ERROR CORRECTING BITS

TECHNICAL FIELD

The present disclosure relates to data processing and particularly storage of bits in a data processing apparatus.

DESCRIPTION

In a data processing apparatus, storage circuitry is used to store data. While it is often desirable to increase the capacity of storage circuitry, this has an impact on the size of the circuitry being employed and therefore the power consumption used by that circuitry, even while idle. During the storage of data, the data can become corrupted (e.g. due to transient errors). One way to prevent this is by the use of check codes, which are stored separately from the data and can be used to detect, and in some cases correct, a limited number of errors in the data. However, extra storage space is generally required to store the check bits, and this leads to the previous problems of increased circuit space and power consumption. It would be desirable to increase the effective storage capacity of storage circuitry without simply adding further storage cells, which can lead to increased circuit size and power consumption.

SUMMARY

Viewed from a first example configuration, there is provided a data processing apparatus comprising: storage circuitry comprising a plurality of lines, each of the plurality of lines comprising a data value; and access circuitry to access a pair of the plurality of lines at a time, the pair of the plurality of lines comprising a further data value, distinct from the data value, and a plurality of error bits to detect or correct errors in the data value in each line in the pair of the plurality of lines.

Viewed from a second example configuration, there is provided a data processing method comprising: storing a plurality of lines, each of the plurality of lines comprising a data value; and accessing a pair of the plurality of lines at a time, the pair of the plurality of lines comprising a further data value, distinct from the data value, and a plurality of error bits to detect or correct errors in the data value in each line in the pair of the plurality of lines.

Viewed from a third example configuration, there is provided a data processing apparatus comprising: means for storing a plurality of lines, each of the plurality of lines comprising a data value; and means for accessing a pair of the plurality of lines at a time, the pair of the plurality of lines comprising a further data value, distinct from the data value, and a plurality of error bits to detect or correct errors in the data value in each line in the pair of the plurality of lines.

BRIEF DESCRIPTION OF THE DRAWINGS

The present invention will be described further, by way of example only, with reference to embodiments thereof as illustrated in the accompanying drawings, in which.

DESCRIPTION OF EXAMPLE EMBODIMENTS

Before discussing the embodiments with reference to the accompanying figures, the following description of embodiments is provided.

In accordance with one example configuration there is provided a data processing apparatus comprising: storage circuitry comprising a plurality of lines, each of the plurality of lines comprising a data value; and access circuitry to access a pair of the plurality of lines at a time, the pair of the plurality of lines comprising a further data value, distinct from the data value, and a plurality of error bits to detect or correct errors in the data value in each line in the pair of the plurality of lines.

In the above aspect, pairs of storage lines (such as cache lines) are accessed at the same time. That is, in response to one access request for data in one line, two separately stored storage lines are retrieved. Each of the lines contains its own data value. Meanwhile, the pair of lines collectively contains a series of error bits. The error bits are produced by an error correction algorithm, such as a Cyclic Redundancy Check (CRC) algorithm, being applied to a data value. By means of the error bits, it is possible to detect one or more bits in the data value that have been flipped, e.g. due to transient errors. That is, if one or more bits of the data value on which the error bits have been produced are corrupted, then to some extent it is possible for that error to be detected. In some cases, it is also possible for the error to be corrected. As a consequence of the presence of the error bits, and the storage lines being accessed in pairs, it is possible to store a further (additional) data value within the pair of storage lines. This is achieved without increasing the number of bit cells of the storage circuitry. The further data value is distinct from the data value in that that the further data value is not merely an arbitrary division of the data value. In practice, this means that the error bits are produced on the basis of the data value and not on the basis of the further data value.

In some examples the data processing apparatus comprises: permission circuitry to check the further data value to determine whether an accessor of the data value is permitted to access the data value. The further data value can therefore be used by the permission circuitry to determine access permissions for an accessor of the data value to determine whether that accessor is allowed to access the data value.

In some examples, the further data value indicates an owner of the pair of the plurality of lines in which the further value is contained. There are a number of ways in which the further data value can be used in order to check whether an accessor is permitted to access the data value. However, in these examples, the further data value indicates an owner of the pair of the plurality of lines containing that further data value. In this way, it can be assumed that only the owner of the pair of lines is permitted to access (read or write) that particular line.

In some examples, the owner is identified by an identifier associated with an execution environment. The owner of a line can be identified in a number of different ways. However, in these examples, the owner is indicated on the basis of an identifier associated with an execution environment. For instance, the identifier could be an identifier of a process, thread, operating system, virtual machine, CPU, virtual CPU, machine, or other environment in which a stream of instructions can be said to execute. Typically, such ownership may be segmented so that a particular application is restricted from accessing data belonging to another application. This makes it possible for personal or confidential information being used by one application to be restricted so that it is only accessed by that application.

In some examples, the further data value is an MTE tag. Memory Tag Extension (MTE) tags are a security feature in which a multi-bit tag (e.g. a 4-bit tag) is used to check access of, e.g. memory pointers, so that only a particular execution environment associated with the correct tag is permitted access. In particular, when an execution environment requests a memory allocation, an MTE tag associated with the current execution environment is allocated to that block of memory. Going forward, any memory access made to that area of memory must be made by an execution environment having the same tag for that access to be successful. Accesses made by other execution environments can be denied.

In some examples, the error bits are ECC bits. Error Correcting Code (ECC) memory is used in order to detect and correct corruption of data in memory. In particular, the data value to be stored in a line of memory is applied to an algorithm in order to generate a set of ECC bits. These ECC bits can be compared to the data value at any time in order to determine whether a correspondence still exists. If no correspondence exists, then it may be concluded that the data value has become corrupted. The algorithm that is used to generate the ECC bits is such that a limited number of errors in the data value can be detected. In particular, it is possible to detect a number of bits of the data value that have been flipped. For instance, the algorithm may be such that the ECC bits can be used in order to detect up to two bits that have been flipped in the data value. In addition, ECC bits generated by the algorithm may be such that it is possible to correct bits in the data value that have been flipped. In other words, the ECC bits may be sufficient in order to determine precisely which bit or bits have been flipped so that these bits can be corrected to the appropriate value. Typically, ECC bits are able to detect one more error than they are able to correct. For instance, ECC bits may be such that they are able to detect two errors and correct one error in a data value.

In some examples, the further data value is encoded into a set of selected bits comprising at least one of: at least some of the error bits and at least some of the bits making up the data value. In particular, in some embodiments, the further data value is encoded into at least some of the error bits and at least some of the bits making up the data value. By encoding the further data value into a large number of bits, it is possible to provide a large space into which such an encoding can occur. When the encoding space is sufficiently large, it is possible to provide encodings for each possible value of the further data value that are unique.

In some examples, the error bits comprise the further data value in an encoded form. There are a number of ways in which space can be saved in order to make way for the further data value. However, in these examples the further data value is included within the pair of lines by encoding it within the error bits themselves. For instance, the error bits may be intentionally corrupted in such a way that the further data is encoded within those error bits. This encoding of the further data value in the error bits means that the error bits can still be used in order to detect and/or correct errors in the data value.

In some examples, the further value is encoded into the set of the selected bits by inversion of a plurality of the selected bits, wherein positions of the plurality of the selected bits indicate the further value. One way in which the further data value can be encoded is by selectively inverting some of the selected bits. In particular, the positions of the bits that are inverted can be used to indicate the further value. For instance, the inversion of the first and second bits could correspond to a further value of one, the inversion of the first and third error bits could correspond with the further value being two, the inversion of the first and fourth error bits could correspond with the further value being three, etc. Clearly, it is not necessary for every single combination of bits to correspond with a different possible value for the further value. In particular, if there are only a limited number of possibilities for the further value, then only that many different combinations of inverted error bits need correspond with different values of the further value. In some embodiments, where the encoding space is large, each possible bit in the selected bits is used for only a single possible value of the further data value. For instance, if there are eight selected bits and eight possible values of the further data value, then each bit can correspond to its own value of the further data value.

In some examples, a number of the plurality of the selected bits that are inverted is equal to, at most, a number of errors that are detectable using the error bits. By restricting the number of error bits that can be inverted in order to encode the further value, it is possible to continue to use the error bits in order to detect and/or correct errors in the value. Clearly, if a number of error bits that were inverted exceeded the number of errors that could be detected using the error bits, then the error bits could not be used to detect errors in the value. In some embodiments, the number of the plurality of error bits that are inverted is equal to the number of errors that are detectable using the error bits.

In some examples the data processing apparatus comprises: a test circuit to perform inversion on at least some comparison error bits that are generated using the data value of a first of the plurality of lines to produce inverted comparison error bits and to perform a comparison of the inverted comparison error bits to the error bits in the first of the pair of the plurality of lines, wherein the error bits and the inverted comparison error bits are generated from the data value using a same algorithm. Having inverted the error bits, it is possible to continue to use the error bits in order to detect or correct errors in the data value. This can be achieved by means of the test circuit. Comparison error bits are generated using the data value and the same algorithm that was used to generate the error bits themselves. Under normal circumstances, if none of the error bits had been inverted, then in the absence of corruption, one would expect the comparison error bits to be the same as the error bits themselves. In this situation however, some of the error bits have been intentionally inverted. By inverting some of the comparison error bits to determine a match with the error bits, it is possible to determine which bits have been intentionally inverted. This in turn makes it possible to ascertain the further data value.

In some examples, the data processing apparatus comprises: a plurality of the test circuit, wherein each test circuit inverts different comparison error bits; and analysis circuitry to identify which of the plurality of the test circuit has inverted comparison error bits that match the error bits. Rather than using one test circuit to selectively invert each combination of the comparison error bits, produce multiple sets of inverted comparison error bits, and thereby determine which bits must be inverted, it is possible to provide a plurality of the test circuits, with each of the test circuits inverting a different combination of bits. In this way, it is possible to test each combination of inverted comparison bits in parallel. One can therefore determine the further data value more quickly. In practice, in the absence of any data corruption, all but one of the test circuits will produce a mismatch between the comparison error bits and the error bits. The test circuit that produces a match between its inverted comparison error bits and the error bits can be used to identify the further data value that was encoded into the error bits.

In some examples, in response to each of the plurality of the test circuit producing inverted comparison error bits that differ from the error bits, each test circuit is adapted to perform a further comparison between further inverted comparison bits generated using the data value of a second of the pair of the plurality of lines and the error bits of the second of the pair of the plurality of lines, in order to determine the data value. Of course, it is possible that further corruption to the error bits or the data bits has occurred—i.e. beyond the intentional corruption used to encode the further data value. In this situation, each of the test circuits will produce a set of inverted comparison error bits that differ from the error bits. This is because in a situation in which corruption of the data value or the error bits occur, the error bits will not correspond with the data value. In such a situation, it is possible to consider the second of the pair of the plurality of lines. Since the further data value is the same for both lines in a pair, it is possible to do the same comparison using the data value and the error bits of the second of the pair of lines. Once the further data value has been determined in this manner, it is possible to re-invert the error bits of the first line—i.e. to undo the intentional corruption to the error bits of the first line that was performed. This can then in turn be used to correct and/or detect errors in the data value of the first line.

In some examples, the data processing apparatus comprises: generation circuitry to generate the error bits from the data value, and to invert at least some of the error bits, wherein the at least some of the error bits are selected based on the further data value. The generation circuitry is responsible for generating the error bits at a time that a data value is inserted into the storage circuitry. By selecting which of the error bits are to be inverted, it is possible to encode a different further data value, as explained above.

In some examples, the data processing apparatus comprises a first mode of operation in which the error bits are adapted to detect or correct errors in the data value in each line in the pair of the plurality of lines as a single data value. Another way in which the further data value can be stored within the storage circuitry without increasing the number of bit cells in the storage circuitry is to treat the two data values in each of the lines of the pair of lines as a single data value and to determine the error bits for that single data value as opposed to producing two sets of error bits with each set of error bits being directed towards a data value in a different one of the two lines. Such embodiments take advantage of the fact that the number of error bits required to detect or correct errors increases non-linearly with respect to the size of the data value for which the error bits are generated. In particular, in the case of an algorithm that has a Hamming distance of four, as in the case with Single Error Correction, Double Error Detection (SECDED), eight error correcting bits can be used in combination with up to 120 data bits, of which only 64 bits are used in a register that stores 64 data bits and eight error bits. However, by increasing the number of error correcting bits to nine, 247 data bits can be supported—enough for two registers that collectively store 128 bits. Consequently, by treating the pair of data values in each of the pair of lines as a single data value, fewer error bits are required than would be required for two distinct data values, since one lot of 137 bits (nine error correcting bits and two lots of 64 data bits) is less than two lots of 72 bits (two lots of eight error correcting bits and two lots of 64 data bits). The number of error bits required can therefore be reduced and this freed up space can be used in order to store the further data value. Once again, the further data value is kept distinct from the data value in the sense that the error bits do not encompass the further value and cannot be used to detect or correct errors in the further data value.

In some examples, in the first mode of operation, the error bits are distributed across each line in the pair of the plurality of lines. That is to say that not all of the error bits are found in a single line, but could instead be distributed between the two lines. In some embodiments, the split is equal so that an equal number of bits are located in each of the two lines.

In some examples, the error bits are located in same bit positions in each line in the pair of the plurality of lines. This makes it efficient for the purposes of wiring so that it is consistent as to where particular bits having particular functions are stored within each of the lines of the storage circuitry.

In some examples, the data processing apparatus comprises a second mode of operation in which the error bits in each line in the pair of the plurality of lines are specific to the data value stored in that line in the pair of the plurality of lines; and the data processing apparatus comprises switching circuitry to switch between the first mode of operation and the second mode of operation. The apparatus may be capable of switching between the first mode of operation in which the error bits treat the data values in the two lines as a single value, and a second mode of operation in which the error bits in each line are generated based on the data value in that line to the exclusion of the data value in the second line of the pair. It will be appreciated that in the first mode of operation, although error detection and correction is still possible, the capability for this is limited as compared to the second mode of operation. In particular, in the first mode of operation, it is only possible to detect or correct X errors out of 2N bits. In the second mode of operation, however, it is possible to detect or correct X errors in N bits. However, this more limited error checking and detecting capability provides more storage capability. Consequently, by providing switching circuitry, it is possible to switch between these two modes of operation depending on whether it is desirable to improve the error correction and detection capability or whether it is desirable to increase the storage capacity. Such a desire may be determined on a case-by-case basis but could also be determined when a data processing apparatus is activated. This second mode of operation may therefore not use MTE tags at all. However, in some embodiments, the second mode of operation could correspond to the above-mentioned process in which the further data (e.g. an MTE tag) is encoded within the ECC bits. Alternatively, in some other embodiments, the above-mentioned encoding process operates as a third mode of operation.

Particular embodiments will now be described with reference to the figures.

Figure 1:
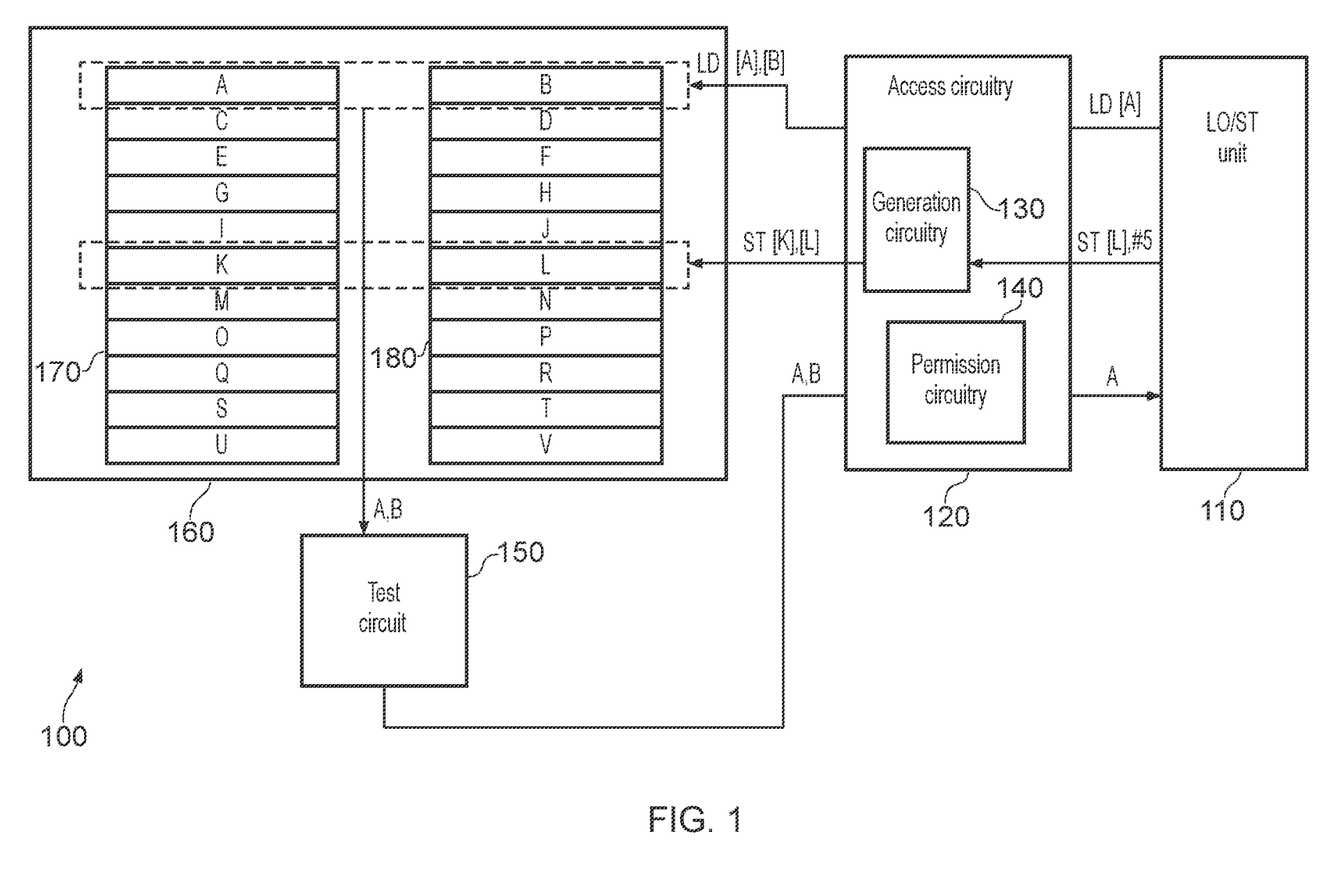
FIG. 1 schematically illustrates an apparatus in accordance with some embodiments.

FIG. 1 schematically illustrates an apparatus 100 in accordance with some embodiments. The apparatus includes a load/store unit 110, which is responsible for performing access operations on storage circuitry 160. The access operations that are issued by the load/store unit 110 are transmitted to access circuitry 120, which determines, from an access address provided by the access operation, the specific circuits 170, 180 in the storage circuitry 160 that are to be accessed. In these embodiments, each of the entries (A-V) of the storage circuits 170, 180 comprises a set of data bits and a set of error bits. The error bits represent a block code corresponding to the data bits. Once retrieved, the data bits and error bits are passed to a test circuit 150 that tests the data bits against the error bits to determine whether the integrity of the data is intact. The result of this test is then passed back to the load/store unit 110 via the access circuitry 120.

In these embodiments, each of the entries in the storage circuitry 160 makes use of Memory Tag Extension (MTE) tags, which are a security feature used to check the permission of access requests so that only the relevant execution environment is permitted to access the data. These tags are checked by a permission circuit 140 against a corresponding tag provided as part of the access request. In this embodiment, the permission circuitry 140 forms part of the access circuitry, but could be located elsewhere in other embodiments. In the event that an execution environment (e.g. a thread, process, operating system, hypervisor, CPU, etc.), other than the one to which the particular entry belongs, attempts to access that entry (e.g. if a non-corresponding MTE tag is provided in the access request, or if no MTE tag is provided in the access request) then the permission circuit 140 will intervene. This may take the form of, for instance, an exception or fault being raised, or could simply cause the access to be noted. If the execution environment has permission to access the requested data, then the permission circuit 140 permits the access (e.g. read or write) to take place. Note that the exact manner in which the permission circuitry 140 performs permission checking is not essential to the present technique.

One way to store the access information for a particular entry (A-V) of the storage circuitry 160 is to store the relevant MTE tag alongside the entry. However, this requires the amount of storage space for the storage circuitry 160 to be increased. In particular, a large number of bits may be provided in order to store the further data corresponding to the MTE tags. This therefore increases the size of the circuitry and also its power consumption.

In the present embodiment, pairs of entries or lines are accessed together. For instance, if an access request is made to data entry A, then data entry B may also be accessed at the same time. Similarly, if a data access request is made to a line L, then the access circuitry 120 may cause entry K to be accessed at the same time. As a consequence of entries being accessed in pairs, it is possible to make more efficient use of the bits that are used for storing the block codes (e.g. ECC bits). Consequently, the bits that are used for accessing permissions (e.g. the MTE tags) can be stored without an increase in the number of bit cells required. As such, it is possible to avoid significant increases circuitry size or power consumption. Furthermore, this can be achieved without significantly affecting the error detection and correction capability via the ECC codes.

Generation circuitry 130 is provided in order to generate the ECC bits and the MTE tags. Consequently, the generation circuitry 130 can be used for write requests issued by the load/store unit when data is to be written to the storage circuitry 160 together with the appropriate ECC bits and MTE tags.

In practice, it will be appreciated that the present embodiments are not limited to the use of MTE tags and could be used to store various other forms of data that are distinct from the data used to generate the error bits. Similarly, although the present embodiments are particularly concerned with the use of ECC bits, the embodiments are not limited to this and could consider other forms of error bits.

There are a number of ways in which accessing the data lines in pairs allows efficient storage of the MTE bits together with the ECC bits.

Figure 2A:
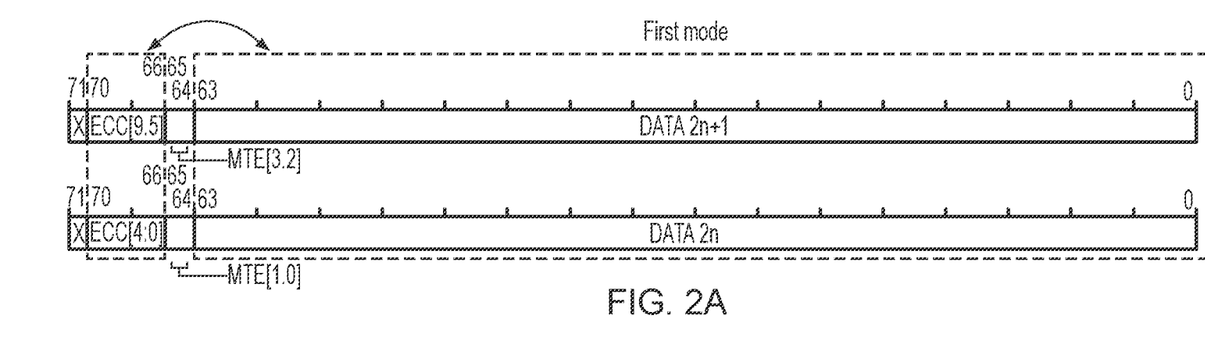
FIG. 2A illustrates a first manner in which the bits can be stored in the storage circuitry in accordance with some embodiments.
Figure 2B:
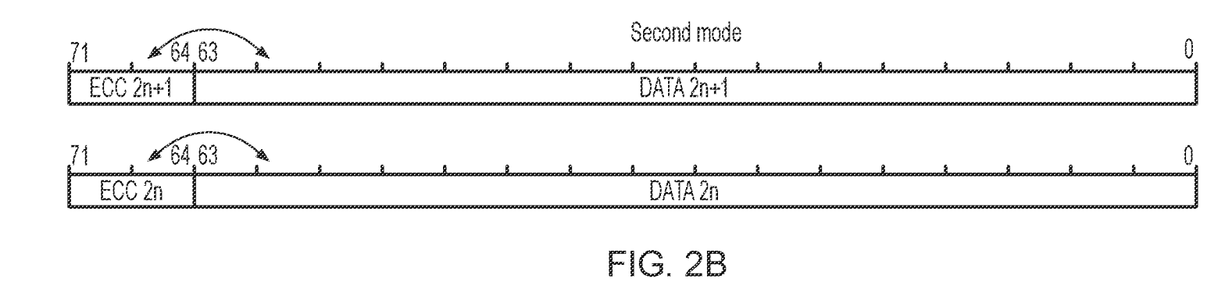
FIG. 2B illustrates a second manner in which the bits can be stored in the storage circuitry in accordance with some embodiments.

FIG. 2A illustrates a first mode of operation, which controls how the bits can be used in order to store the MTE tags. Once again, a pair of lines $2n$, $2n+1$ is provided. Each of the lines also contains data extending from bits 0-63. In this case, however, the ECC bits are generated for the data values of both lines $2n$, $2n+1$. That is, the ECC bits are generated on the data from bits 0-63 of line $2n$ and bits 0-63 of line $2n+1$ (a total of 128 bits). This process takes advantage of the fact that the number of ECC bits required for a given item of data increases non-linearly with respect to the size of that data. For instance, in a SECDED code (Single Error Correction, Double Error Correction code) eight bits are required to provide coverage to a 64 bit data value. However, only nine bits are required to provide coverage to a 128 bit data value. Consequently, by generating the ECC code for both of the data values in lines $2n$ and $2n+1$ together, fewer ECC bits are necessary. As a consequence, the remaining bits that would otherwise be used when storing two distinct ECC values, can instead be used to store the MTE tag. For example, as illustrated in FIG. 2B, if the ECC bits (requiring eight bits in total) are equally split across the two data lines, then the MTE tag (requiring four bits) can also be equally split across the two data lines. This leaves a single remaining bit (x) which can be used for further storage, or could be used to extend the MTE tag space.

FIG. 2B illustrates a second mode of operation, which controls how the bits can be used to store an MTE tag. In particular, for a line $2n$, bits 0-63 are used to store the data. Bits 64-71 are then used to store a corresponding ECC code that corresponds with the data of the same line (the data of bits 0-63). Consequently, the partner line $2n+1$ has its own data extending from bits 0-63 and its own ECC code from bits 64 to 71 that correspond with the data in bits 0-63 of line $2n+1$. These two lines are accessed together as a pair. The MTE tag will be the same for each of the two lines $2n$, $2n+1$ and is also stored in each of the two lines. In these examples, the MTE tag is stored by intentionally flipping a subset of the bits in the ECC code. By selecting which of the bits is flipped, it is possible to encode a different value for the MTE tag. For instance, if one combination of bits is flipped then the MTE tag will be different than if a second combination of bits is flipped. In this way, the MTE tag can be encoded within the ECC bits and therefore the MTE tag as a further data value can be stored within each of the lines $2n$, $2n+1$ without necessitating additional storage bits.

Note that in this example the bits that are selected for encoding the MTE tag are the ECC bits. However, in other embodiments, the bits that are selected could be the data bits, or could be a set of the data bits and a set of the ECC bits. By allowing the encoding to take place over a larger set of bits, it is possible to provide more possible encodings of the MTE tag. Furthermore, it is possible for certain of the bits to uniquely correspond to a particular MTE tag value.

It will be appreciated that the organisation of precisely where the ECC bits are located and where the MTE tag is located (when not encoded within the ECC bits) is arbitrary. However, by placing the relevant bits in the same location of each of the two lines, the wiring that is necessary to extract the relevant bits can be simplified. Of course, in some embodiments, there may be sufficient bits in order to provide all of the ECC bits or all of the MTE tag bits in a single line. However, since the access of either of the two lines will require both the ECC bits and the MTE bits, both lines are still accessed.

Note that other modes of operation are also possible. For instance, in some embodiments, the second mode of operation could be provided with a mode of operation in which no encoding takes place. Alternatively, the first mode of operation could be provided with a mode in which no MTE tags are used and in which the ECC bits are specific to the data value in each line. In yet other embodiments, three modes of operation can be provided, including the two modes of operation described in respect of FIGS. 2A and 2B, but also a further third mode of operation in which no encoding takes place and in which MTE tags are not used. Still other combinations will be clear to the skilled person.

Figure 3:
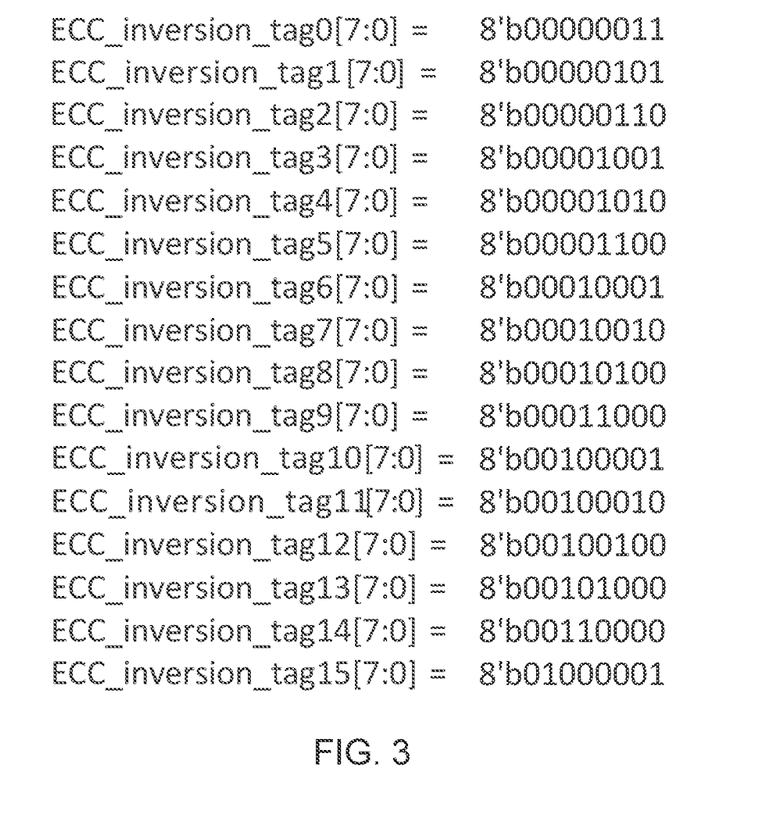
FIG. 3 illustrates a way in which encoding of MTE tags into error bits (e.g. ECC bits) can be achieved.

FIG. 3 illustrates a way in which encoding of the MTE tags into the ECC bits can be achieved in the second mode of operation. This process is performed after the ECC bits have been generated for particular data. For each different value of the MTE tag, a different combination of the ECC bits are inverted as illustrated in FIG. 3. For instance, in order to represent that MTE tag '6', bit numbers zero and four need to be inverted. If the MTE tag '11' is to be encoded, then bits zero and five of the ECC bits are inverted. In practice, the inversion could be achieved by performing a XOR operation between the ECC bits and the bits shown in FIG. 3 for each of the different MTE tags. So if the ECC bits were 10111011 and the MTE tag '12' was to be encoded then the operation 10111011 XOR 00100010=10011001 can be performed.

As previously stated, it is possible for the ECC bits and/or the data bits to be used for encoding the MTE tags in the second mode of operation and by increasing the number of bits used for the encoding, a unique inversion is possible for each encoding. Using both the ECC bits and data bits allows a unique inversion for each value of the MTE tag, which avoids aliasing shared bits.

Figure 4:
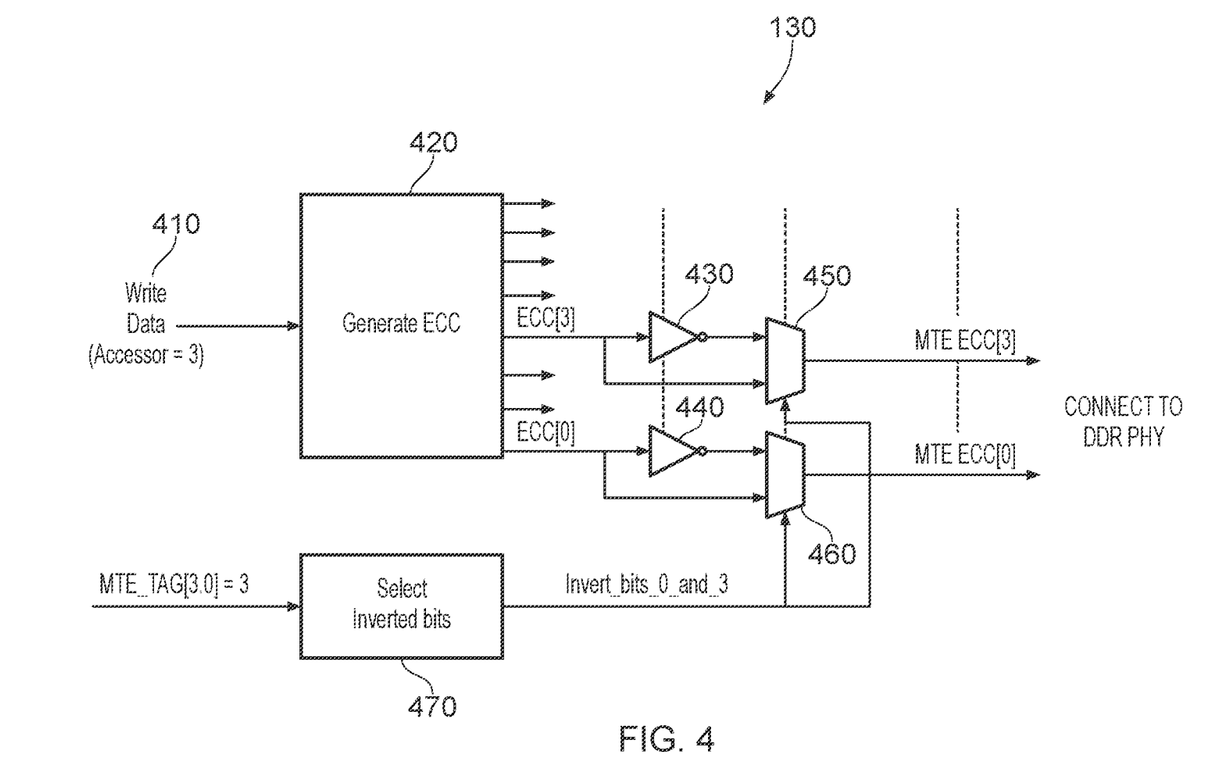
FIG. 4 illustrates the generation circuitry in more detail, in accordance with some embodiments.

FIG. 4 illustrates the generation circuitry 130 for use in the second mode of operation in more detail. As previously discussed, the generation circuitry is used for a write request in order to generate the ECC bits and to encode the further data into the ECC bits. In the example shown in FIG. 4, the MTE tag to be encoded is '3', since the MTE tag provided by the accessor is '3'. As shown in FIG. 3, the MTE tag of '3' corresponds with the inversion of bits zero and three. Returning to FIG. 4, write data that is to be written to the storage circuitry 160 passes through the generation circuitry 130 of the access circuitry 120. Here, ECC generation circuitry 420 is used to generate the ECC code. The ECC code in this example is generated as an 8-bit number. Each bit is output separately and passes through an inverter 430, 440. Each original bit and the inverted form of that bit are passed to a multiplexer. The multiplexers can therefore be used in order to determine whether the original bit or the inverted bit should be passed as an output. In practice, this is achieved via a selection signal which is output by selection circuitry 470. In this example, since the MTE tag to be encoded is the value '3', this is received by the selection circuitry 470, which passes a signal, which causes the selection signal to two of the multiplexers 450, 460 to select the inverted bits rather than the original bits. Consequently, in the case of bits zero and three, the inverted form of the bit is output. In other cases, the un-inverted form of the ECC code is output. In this way, an ECC code whose bits have been selectively inverted is output with the selected bits corresponding to a particular value of an MTE tag. Note that by inverting specific individual bits as indicated by the MTE tag, there is no need to perform the XOR operation on a complete set of bits.

Figure 5:
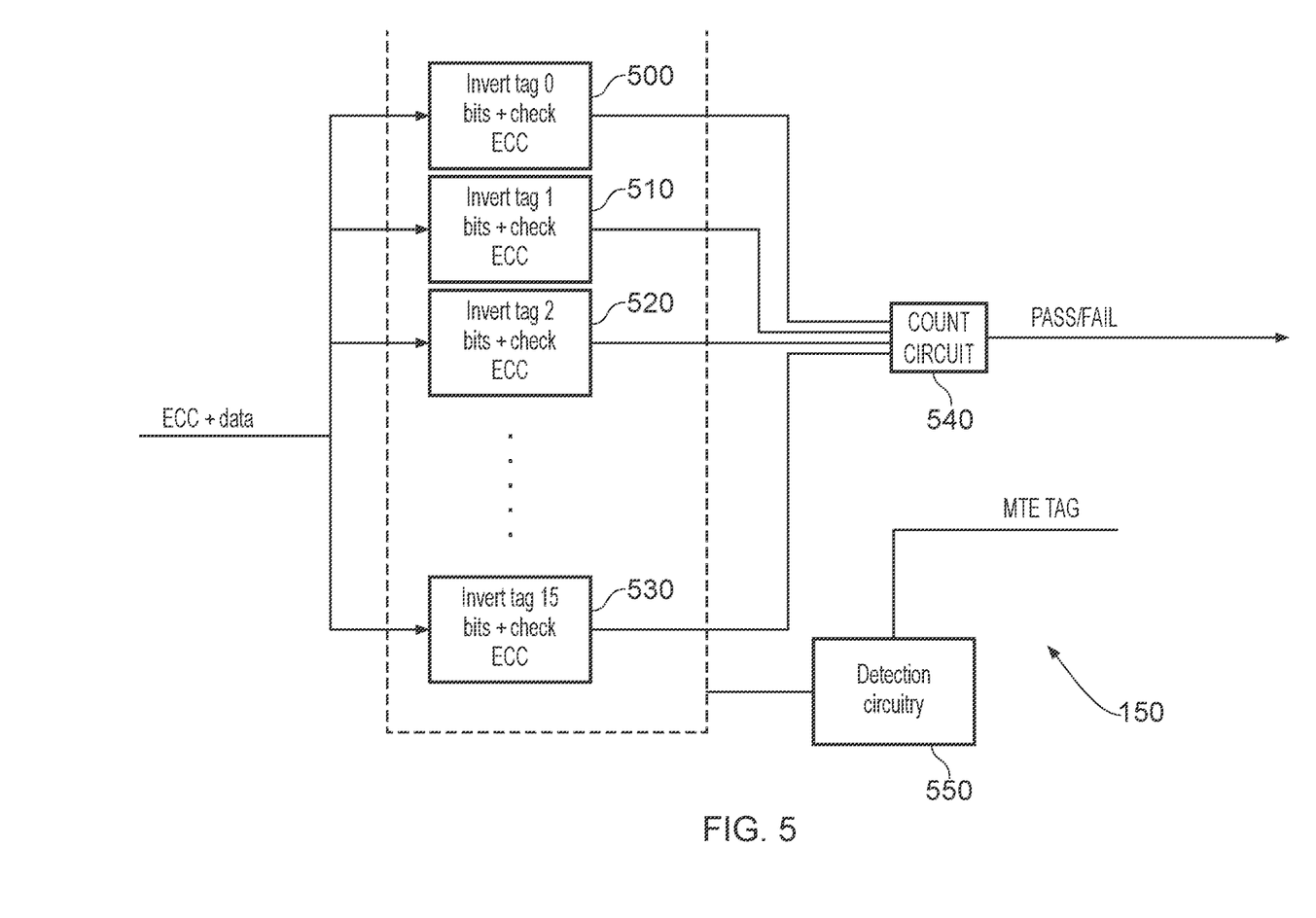
FIG. 5 illustrates the test circuit in more detail in accordance with some embodiments.

FIG. 5 illustrates the test circuit 150 for use in the second mode of operation in more detail. The test circuit 150 can be used in order to check the integrity of the data. It will be appreciated that in the second mode of operation, the ECC bits will have been intentionally tampered with. In particular, some of the bits making up the ECC code will have been intentionally inverted. However, the circuitry illustrated in FIG. 5 does not have its error checking capability reduced as a consequence. In particular, the data together with the corresponding ECC code is received by the test circuitry 150 from the storage circuitry 160. Here, the data and ECC code is passed to a plurality of testing circuits 500, 510, 520, 530. Each of these circuits inverts a different set of the ECC bits that are stored together with the data. In practice, each of the testing circuits will invert a different set of the ECC bits as shown in FIG. 3. For instance, the first testing circuitry 500 will invert bits zero and one, while the $16^{th}$ testing circuit 530 will invert bits four and five. The data bits will then be checked against the modified bits of the modified ECC code. It may be expected that in 15 or the 16 cases, the ECC check will fail. However, in one of the testing units 500, 510, 520, 530, the ECC check should pass (assuming no unintentional corruption has occurred). The testing circuit that produced the pass therefore corresponds with the MTE tag that was encoded within the ECC bits. For instance, if a testing circuit were to invert bits two and three and this were to lead to a valid ECC check, then the MTE tag that had been encoded would be the value '5'. A count circuit 540 can be used to determine whether exactly one of the testing circuits produced a valid ECC check and therefore determine whether the ECC bits and data bits matched. Detection circuitry 550 can be used to determine which of the testing circuits 500, 510, 520, 530 caused a match to occur and to translate this information into the corresponding MTE tag.

Where each of the testing circuits 500, 510, 520, 530 fails, or where multiple testing circuits 500, 510, 520, 530 pass, the data has become corrupted. Multiple passes can occur as a consequence of aliasing—e.g. a bit being used in multiple different inversion combinations, as is the case in FIG. 3. Here, a single failure can decode to two potential MTE tags. Since the ECC bits have been modified, it may not be possible to use the ECC bits to detect and/or correct the corruption. However, since the data lines are accessed in pairs and since the MTE tag is the same for a pair of lines, it is possible to use the second line of the pair in order to correct the situation. For instance, consider a situation in which a data access request is made for data line A in FIG. 1. Both data lines A and B are retrieved and passed to the test circuit 150. If, during the operation of the test circuit, it is determined that the data stored in data line A has been corrupted then the same process can be used in order to extract the MTE tag from data line B. At this point, the MTE tag can be returned. Since the MTE tag also indicates which bits were inverted in the error bits for lines A and B, it is possible to reverse the inversion that was performed on the ECC bits of line A. The inversion can then be reversed and the reversed ECC bits can be used in order to detect and/or correct the data value as per the usual ECC process.

Figure 6:
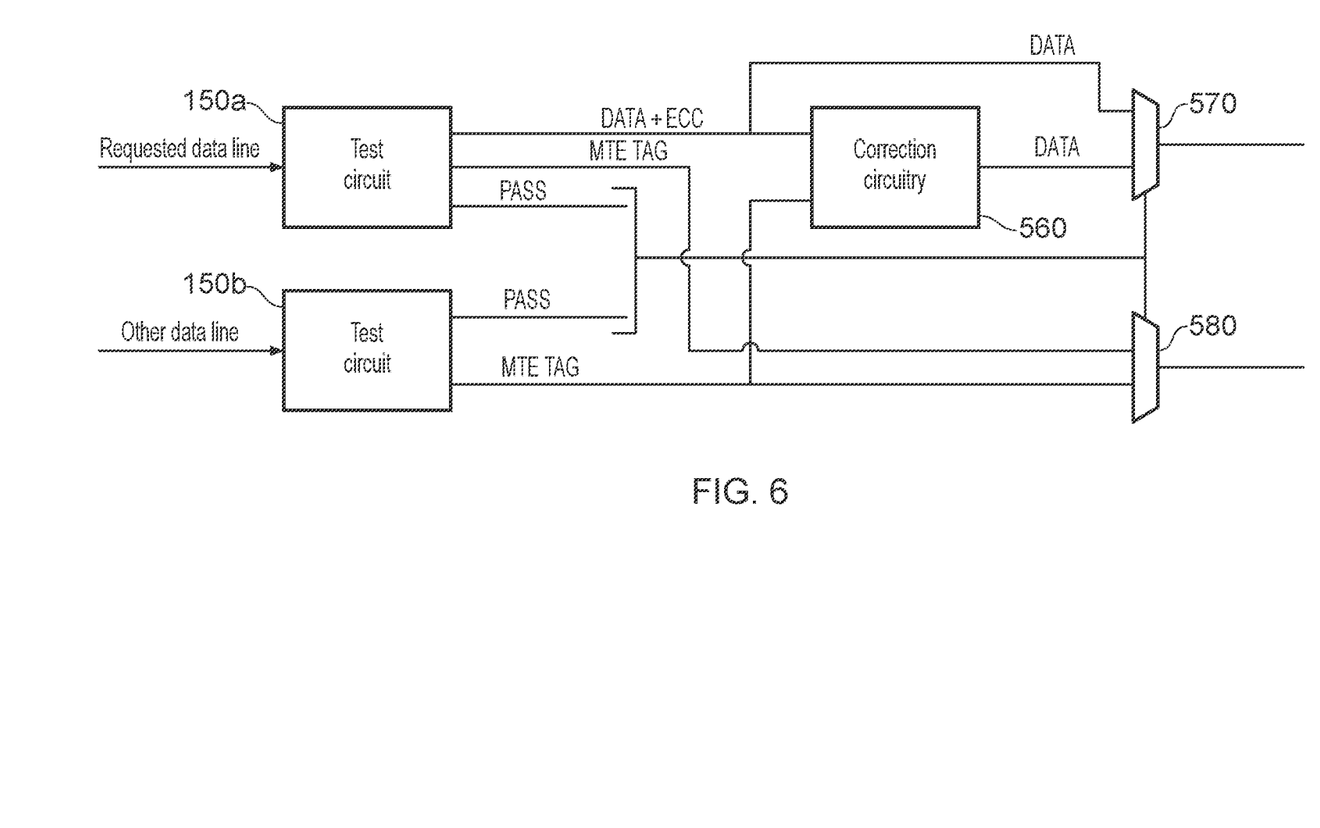
FIG. 6 illustrates an example of circuitry that can be used for testing the data values in two data lines, in accordance with some embodiments.

FIG. 6 illustrates an example of circuitry that can be used for this process. In particular, the test circuit 150 previously illustrated is duplicated as a first test circuit 150a and a second test circuit 150b. Each of the two test circuits 150a, 150b includes the previously mentioned test circuitries 500, 510, 520, 530. The first test circuit 150a receives the requested data line while the second test circuit 150a receives the other data line that forms the pair of data lines that have been accessed. The first test circuit 150a outputs a pass or fail signal, the determined MTE tag, and the determined data. The second test circuit 150b outputs the pass/fail signal and the MTE tag. In practice, the MTE tag that is output by the first test circuit 150a and the second test circuit 150b should be the same. The data that is output by the first test circuit 150a is passed to correction circuitry 560, which also receives the MTE tag obtained from the second test circuit 150b. The correction circuitry 560 uses the supplied MTE tag to reverse the changes that have been made to the ECC bits. This could be achieved by performing an inversion of the bits that have been illustrated with respect to FIG. 3. The exact bits to be selected are known since the MTE tag has been provided to the correction circuitry 560. From there, the correction circuitry 560 can use the ECC bits in order to perform error correction and detection on the data bits. The data is then output by the correction circuitry 560. In addition, the data component of the data and ECC signal output by the first test circuit 150A is also supplied to a multiplexer 570. The selection signal used for the multiplexer 570 is made up from the two pass signals output by each of the first test circuit 150a and the second test circuit 150b. In this way, in dependence on whether the ECC checks performed by the first test circuit 150a passed, either the data output by the first test circuit 150a or the corrected data output by the correction circuitry 560 is output by the multiplexer 570. Similarly with the MTE tag that is output by the first test circuit 150a and the second test circuit 150b, the combined pass signals are used to select between these two sources in order to output the MTE tag that is considered to be valid by a second multiplexer 580. Of course, the two multiplexers 570, 580 could also be configured to output an error signal in response to both of the pass signals output by the first test circuit 150a and the second test circuit 150b indicating errors. In this situation, it is not possible to retrieve the data.

Figure 7:
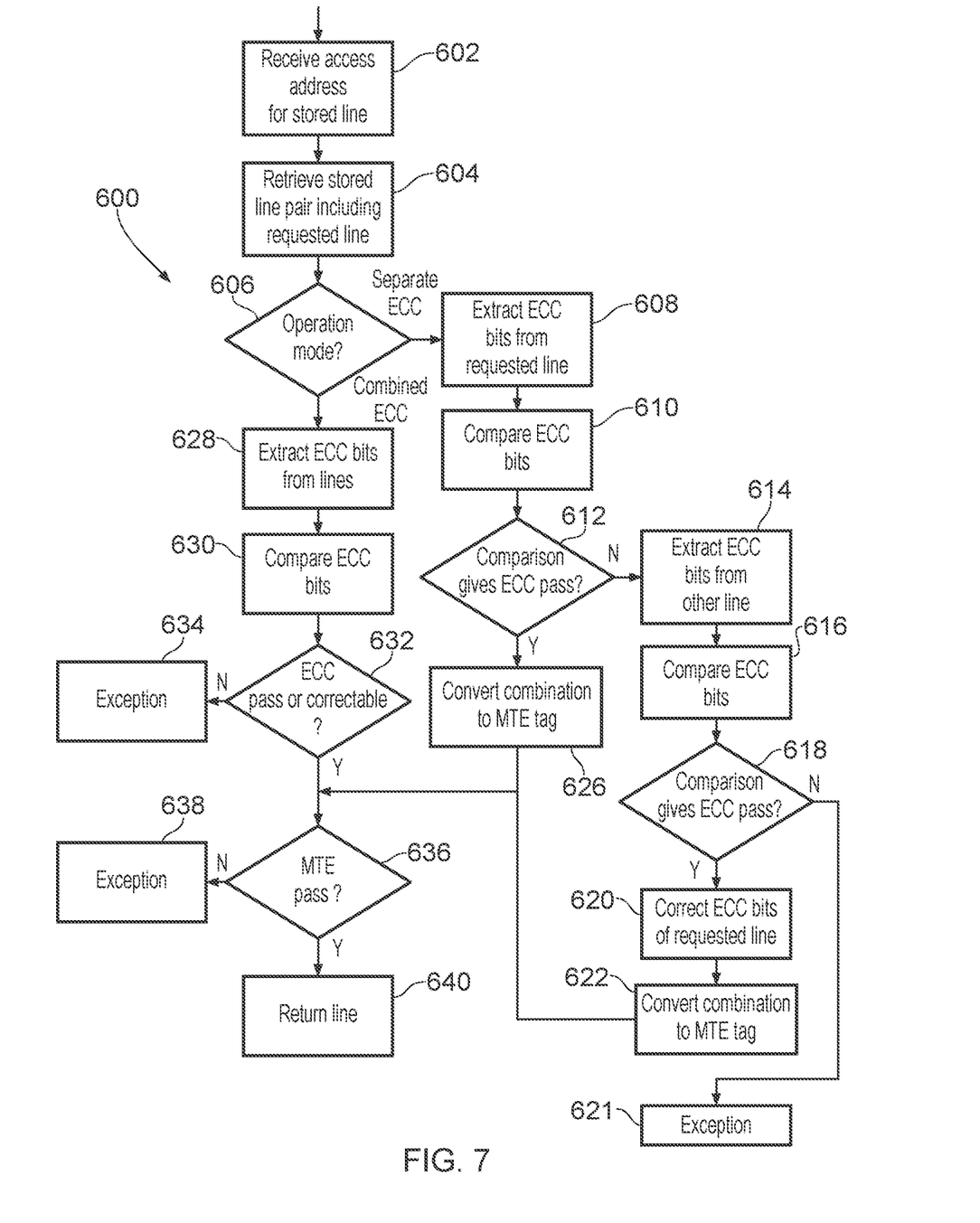
FIG. 7 illustrates a flow chart that shows a process of operation for the apparatus in accordance with some embodiments.

FIG. 7 illustrates a flow chart 600 that shows a process of operation for the apparatus 100. At a step 602, an access request is received for a specific stored line at a given address. In particular, the access may be made to read a requested line A. At a step 604, the stored line and its partner line (e.g. line B) are retrieved. At a step 606, it is determined which mode of operation the apparatus 100 is operating in. In a situation in which the ECC bits are separated (e.g. distinct for each line)—the previously described 'first mode', then at step 608, the ECC bits are extracted from the requested line. At a step 610, the ECC bits are selectively inverted and compared with the data bits in order to determine whether the ECC bits match the data. This can be achieved using the circuitry of FIG. 5, for instance. At a step 612, it is determined whether there is one ECC pass as a consequence of the comparison performed at step 610. If not, then the ECC bits are extracted from the other (partner) line B. At step 616, a comparison is then performed using the ECC bits (again selectively inverted) and data bits that formed part of the partner line B. At step 618, it is determined whether the comparison causes one ECC pass. If so, then at step 620, the ECC bits of the requested line can be corrected. This can be achieved by reinverting those of the ECC bits that correspond with the MTE tag obtained from the partner line. At step 622, the combination of bits that were inverted in order to achieve an ECC pass are then converted into an MTE tag. The process then proceeds to step 636, which will be discussed below. If, at step 618, the comparison does not give an ECC pass for any combination of bits, then the process proceeds to step 624 where an exception is raised. This represents the situation in which the data value cannot be accessed. It may be possible to retry the access operation. In a worst-case situation, the data has become corrupt and a system reset is necessitated. If, at step 612, the comparison leads to an ECC pass, then the combination of bits that were inverted in order to achieve the ECC pass are converted into an MTE tag at steps 626 and the process proceeds to step 636, which is discussed below.

Returning to step 606, if the mode of operation is such that a combined ECC code is used for the pair of lines (the previously described 'second mode'), then at step 628, the ECC bits are extracted from the pair of lines. At step 630, the ECC bits are then compared. At step 632, it is determined whether the ECC bits either provide a pass for the data or can be used to correct the data in the case of a fail. If not, then at step 634 an exception is raised since the data cannot be recovered. This could result in, for instance, a system reset. If the ECC bits either provide a pass for the data or can be used to correct the data, then at step 636 the MTE bits are extracted and it is determined whether an MTE pass occurs. In practice, this can be achieved by comparing the accessing execution environment with the MTE tag. In a situation in which the execution environment is associated with a processor, thread, operating system or hypervisor, it may be necessary for an identifier of the execution environment to be provided as part of the access request. In other situations, the execution environment may be apparent to the access circuitry 120. For instance, if the execution environment is associated with a particular processor ID, then this may be known to the access circuitry 120. If an MTE pass does not occur (if there is an MTE fail), then an exception is raised at step 638. This exception corresponds with a permission exception, since the accessing execution environment is not permitted to access the requested data. Otherwise, at step 640, the requested line is returned.

Accordingly it can be appreciated that by accessing a pair of lines in storage circuitry 160 simultaneously, and by careful use of error bits such as ECC bits, it is possible to provide additional storage space for further data that is not subject to the ECC bits. As a consequence of this, further storage is not necessary for the further data that is being stored. This means that circuit space can be kept small, which causes power consumption to also be kept small as compared to a system where further storage space must be provided. The described process has little effect on the ECC protection process itself. In particular, it is still possible for the ECC bit to be used in order to detect and correct errors.

In the present application, the words "configured to . . ." are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

We claim:

1. A data processing apparatus comprising:
   storage circuitry comprising a plurality of lines, each of the plurality of lines comprising a data value; and
   access circuitry to access a pair of the plurality of lines at a time, the pair of the plurality of lines comprising a further data value, distinct from the data value, and a plurality of error bits to detect or correct errors in the data value in each line in the pair of the plurality of lines,
   wherein the further data value is encoded into a set of selected bits comprising at least one of: the error bits and at least some of the bits making up the data value.

2. The data processing apparatus according to claim 1, comprising:
   permission circuitry to check the further data value to determine whether an accessor of the data value is permitted to access the data value.

3. The data processing apparatus according to claim 1, wherein
   the further data value indicates an owner of the pair of the plurality of lines in which the further data value is contained.

4. The data processing apparatus according to claim 3, wherein
   the owner is identified by an identifier associated with an execution environment.

5. The data processing apparatus according to claim 1, wherein
   the further data value is an MTE tag.

6. The data processing apparatus according to claim 1, wherein
   the error bits are ECC bits.

7. The data processing apparatus according to claim 1, wherein
   the error bits comprise the further data value in an encoded form.

8. The data processing apparatus according to claim 7, wherein
   the further data value is encoded into the set of the selected bits by inversion of a plurality of the selected bits, wherein positions of the plurality of the selected bits indicate the further data value.

9. The data processing apparatus according to claim 7, wherein
   a number of the selected bits that are inverted is equal to, at most, a number of errors that are detectable using the error bits.

10. The data processing apparatus according to claim 7, comprising:
    a test circuit to perform inversion on at least some comparison error bits that are generated using the data value of a first of the pair of the plurality of lines to produce inverted comparison error bits and to perform a comparison of the inverted comparison error bits to the error bits in the first of the pair of the plurality of lines, wherein
    the error bits and the inverted comparison error bits are generated from the data value using a same algorithm.

11. The data processing apparatus according to claim 10, comprising:
    a plurality of the test circuit, wherein each test circuit inverts different comparison error bits; and
    analysis circuitry to identify which of the plurality of the test circuit has inverted comparison error bits that match the error bits.

12. The data processing apparatus according to claim 11, wherein
    in response to each of the plurality of the test circuit producing inverted comparison error bits that differ from the error bits, each test circuit is adapted to perform a further comparison between further inverted comparison bits generated using the data value of a second of the pair of the plurality of lines and the error bits of the second of the pair of the plurality of lines, in order to determine the data value.

13. The data processing apparatus according to claim 7, comprising:
    generation circuitry to generate the error bits from the data value, and to invert at least some of the error bits, wherein
    the at least some of the error bits are selected based on the further data value.

14. The data processing apparatus according to claim 1, wherein
    the data processing apparatus comprises a first mode of operation in which the error bits are adapted to detect or correct errors in the data value in each line in the pair of the plurality of lines as a single data value.

15. The data processing apparatus according to claim 14, wherein
    in the first mode of operation, the error bits are distributed across each line in the pair of the plurality of lines.

16. The data processing apparatus according to claim 14, wherein
    the error bits are located in same bit positions in each line in the pair of the plurality of lines.

17. The data processing apparatus according to claim 14, wherein
    the data processing apparatus comprises a second mode of operation in which the error bits in each line in the pair of the plurality of lines are specific to the data value stored in that line in the pair of the plurality of lines; and
    the data processing apparatus comprises switching circuitry to switch between the first mode of operation and the second mode of operation.

18. A data processing method comprising:
    storing a plurality of lines, each of the plurality of lines comprising a data value; and
    accessing a pair of the plurality of lines at a time, the pair of the plurality of lines comprising a further data value, distinct from the data value, and a plurality of error bits to detect or correct errors in the data value in each line in the pair of the plurality of lines,
    wherein the further data value is encoded into a set of selected bits comprising at least one of: the error bits and at least some of the bits making up the data value.

19. A data processing apparatus comprising:
means for storing a plurality of lines, each of the plurality of lines comprising a data value; and
means for accessing a pair of the plurality of lines at a time, the pair of the plurality of lines comprising a further data value, distinct from the data value, and a plurality of error bits to detect or correct errors in the data value in each line in the pair of the plurality of lines,
wherein the further data value is encoded into a set of selected bits comprising at least one of: the error bits and at least some of the bits making up the data value.

* * * * *